(12) United States Patent
Watanabe et al.

(10) Patent No.: US 7,781,301 B2
(45) Date of Patent: Aug. 24, 2010

(54) METHOD OF FABRICATING SEMICONDUCTOR DEVICE

(75) Inventors: Kei Watanabe, Tokyo (JP); Akifumi Gawase, Ibaraki (JP); Kenichi Otsuka, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/536,631

(22) Filed: Aug. 6, 2009

(65) Prior Publication Data

US 2010/0055893 A1 Mar. 4, 2010

(30) Foreign Application Priority Data

Sep. 2, 2008 (JP) .............................. 2008-224538

(51) Int. Cl.
*H01L 21/76* (2006.01)
(52) U.S. Cl. .............................. 438/422; 257/E21.581
(58) Field of Classification Search ........................ None
See application file for complete search history.

(56) References Cited

U.S. PATENT DOCUMENTS

| | | | | |
|---|---|---|---|---|
| 6,734,094 B2 * | 5/2004 | Kloster et al. | ................ | 438/619 |
| 6,812,160 B2 * | 11/2004 | Juengling et al. | ........... | 438/781 |
| 6,924,222 B2 * | 8/2005 | Goodner et al. | ............. | 438/622 |
| 7,071,091 B2 * | 7/2006 | Clarke et al. | ................ | 438/622 |
| 7,294,568 B2 * | 11/2007 | Goodner et al. | ............. | 438/619 |
| 7,309,649 B2 | 12/2007 | Colburn et al. | | |
| 7,629,225 B2 * | 12/2009 | Naujok et al. | ............... | 438/421 |
| 7,651,891 B1 * | 1/2010 | Nguyen | ...................... | 438/127 |
| 7,666,754 B2 * | 2/2010 | Toma et al. | .................. | 438/422 |
| 2004/0127001 A1 | 7/2004 | Colburn et al. | | |
| 2007/0037380 A1 | 2/2007 | Torres et al. | | |

FOREIGN PATENT DOCUMENTS

JP 05-021617 1/1993

* cited by examiner

*Primary Examiner*—Scott B Geyer
(74) *Attorney, Agent, or Firm*—Finnegan, Henderson, Farabow, Garrett & Dunner, L.L.P.

(57) ABSTRACT

A method of fabricating a semiconductor device according to one embodiment includes: forming an interlayer sacrificial film and an insulating film located thereon above a semiconductor substrate having a semiconductor element, the interlayer sacrificial film having a wiring provided therein; etching the insulating film, or, etching the insulating film and the interlayer sacrificial film to form a trench reaching the interlayer sacrificial film; forming a gas permeable film in the trench; gasifying and removing the interlayer sacrificial film through the trench and the gas permeable film; and forming a sealing film on the gas permeable film for sealing the vicinity of an opening of the trench after removing the interlayer sacrificial film.

20 Claims, 5 Drawing Sheets

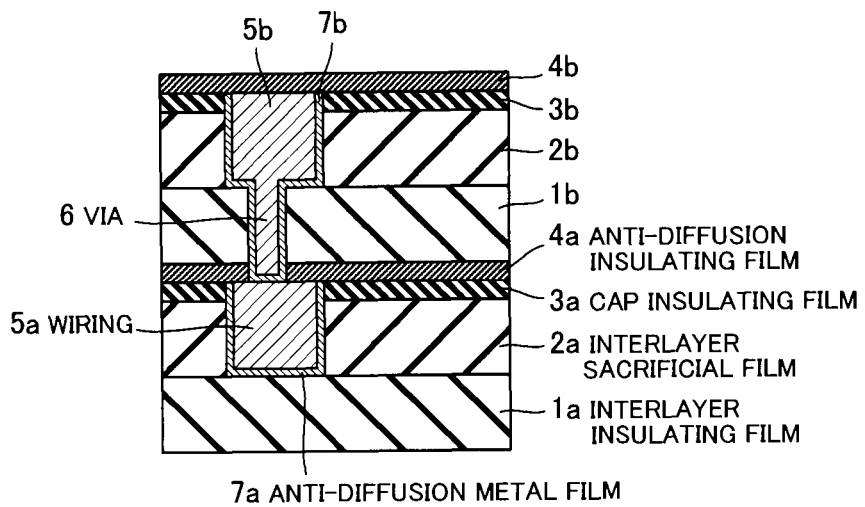
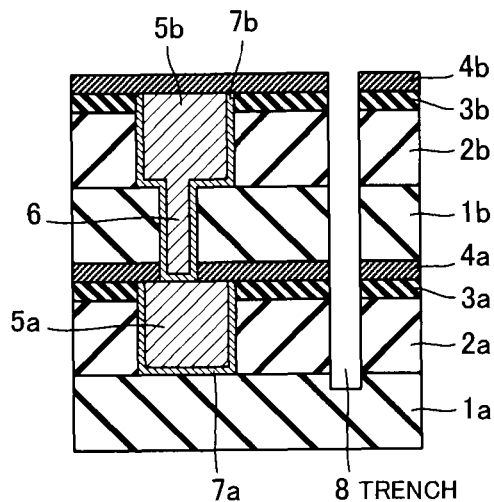
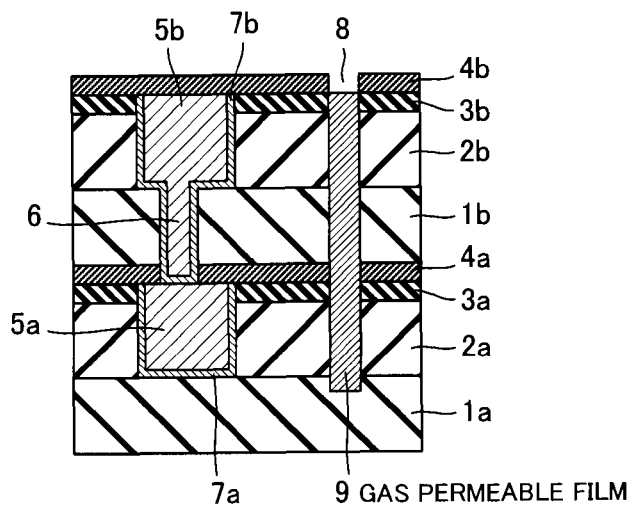
FIG. 1A
FIG. 1B
FIG. 1C

METHOD OF FABRICATING SEMICONDUCTOR DEVICE

CROSS-REFERENCE TO RELATED APPLICATIONS

This application is based upon and claims the benefit of priority from prior Japanese Patent Application No. 2008-224538, filed on Sep. 2, 2008, the entire contents of which are incorporated herein by reference.

BACKGROUND

In accordance with miniaturization of a semiconductor device in recent years, interwiring capacitance of a wiring layer, especially interwiring capacitance of an isolayer tends to increase. When interwiring capacitance increases, parasitic capacitance of a circuit increases, which leads to a decrease in operating speed of a semiconductor device. A semiconductor device is known which has a hollow wiring structure provided with an air gap between wirings in order to reduce the interwiring capacitance.

A method of forming a hollow wiring structure is suggested in which an opening is provided in an insulating film formed on an interlayer insulating film having a wiring formed therein, and after forming an air gap by eliminating the gasified interwiring film through the opening, an insulating film is deposited on the opening for the sealing. This method, for example, is disclosed in JP-A-5-21617.

According to the method described in JP-A-5-21617, by sealing the air gap with the insulating film, it is possible to prevent water or a material of an upper insulating member from entering inside of the air gap, thereby suppressing deterioration in operational reliability of a semiconductor device and an increase in electrical capacitance. However, in practice, it is not possible to completely block the opening due to a problem such as embedding characteristics of an insulating film, etc., which may result in letting water or an insulating material enter in the air gap, or which may result in that an insulating film itself enters in the air gap.

In addition, as described in JP-A-5-21617, when a width of the opening is narrowed by a method such as forming an insulating film sidewall on a side face of the opening for facilitating the blocking of the opening, since the width of the opening is narrow, a removal of the interwiring film, i.e., a formation of an air gap may become difficult.

BRIEF SUMMARY

A method of fabricating a semiconductor device according to one embodiment includes: forming an interlayer sacrificial film and an insulating film located thereon above a semiconductor substrate having a semiconductor element, the interlayer sacrificial film having a wiring provided therein; etching the insulating film, or, etching the insulating film and the interlayer sacrificial film to form a trench reaching the interlayer sacrificial film; forming a gas permeable film in the trench; gasifying and removing the interlayer sacrificial film through the trench and the gas permeable film; and forming a sealing film on the gas permeable film for sealing the vicinity of an opening of the trench after removing the interlayer sacrificial film.

A method of fabricating a semiconductor device according to another embodiment includes: forming a first interlayer sacrificial film and a first insulating film located thereon above a semiconductor substrate having a semiconductor element via a second interlayer sacrificial film and a second insulating film located thereon, the first interlayer sacrificial film having a first wiring provided therein and the second interlayer sacrificial film having a second wiring provided therein; etching the first insulating film, the first interlayer sacrificial film and the second insulating film, or, etching first insulating film, the first interlayer sacrificial film, the second insulating film and the second interlayer sacrificial film to form a trench reaching the second interlayer sacrificial film; forming a gas permeable film in the trench; gasifying and removing the first interlayer sacrificial film and the second interlayer sacrificial film through the trench and the gas permeable film; and forming a sealing film on the gas permeable film for sealing the vicinity of an opening of the trench after removing the first interlayer sacrificial film and the second interlayer sacrificial film.

BRIEF DESCRIPTION OF THE DRAWING

FIGS. 1A to 1E are cross sectional views showing a method of fabricating a semiconductor device according to a first embodiment;

DETAILED DESCRIPTION

First Embodiment

Figure 1D:
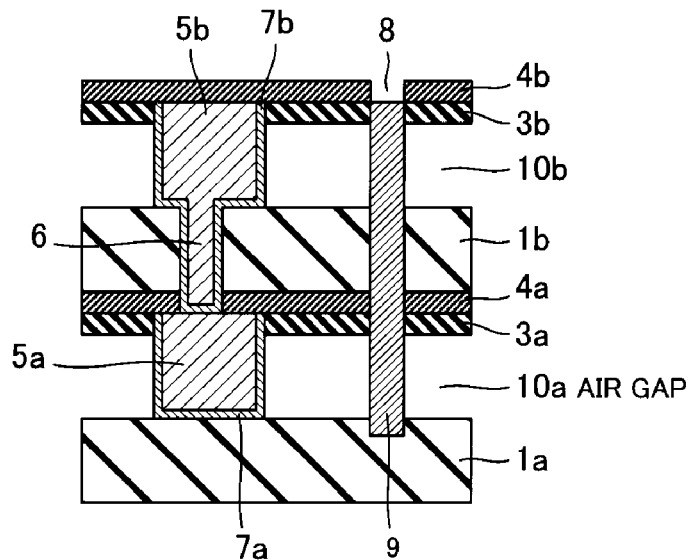

FIGS. 1A to 1E are cross sectional views showing a method of fabricating a semiconductor device according to a first embodiment.

Firstly, as shown in FIG. 1A, an interlayer insulating film $1a$, an interlayer sacrificial film $2a$, a cap insulating film $3a$, an anti-diffusion insulating film $4a$, an interlayer insulating film $1b$, an interlayer sacrificial film $2b$, a cap insulating film $3b$ and an anti-diffusion insulating film $4b$ are laminated in this order on a non-illustrated semiconductor substrate having a semiconductor element, and wirings $5a$, $5b$ and a via $6$ which are formed in those insulating films are provided.

Here, the interlayer insulating films $1a$ and $1b$ are made of, e.g., an insulating material having low-dielectric characteristics such as SiOCH, etc., and is formed using a PE-CVD (Plasma Enhanced-Chemical Vapor Deposition) method or a coating method, etc.

The interlayer sacrificial films $2a$ and $2b$ are made of, e.g., an organic material such as hydrocarbon, etc., which is chemically gasified by forming $CO_2$ by the reaction with an oxygen ion or an oxygen radical, or an organic material such as hydrocarbon, etc., which is thermally gasified by thermal decomposition by thermal energy applied thereto. The interlayer sacrificial films $2a$ and $2b$ are formed using the PE-CVD method or the coating method, etc.

The cap insulating films $3a$ and $3b$ are made of, e.g., an insulating material such as $SiO_2$ or SiOCH, etc., and is formed using the PE-CVD method or the coating method, etc. In addition, the cap insulating films $3a$ and $3b$ have a function of improving processability of a wiring trench or a via hole, or a function of improving a structural strength. Note that, the cap insulating films $3a$ and $3b$ need not be formed.

The anti-diffusion insulating films $4a$ and $4b$ are made of an insulating material such as SiN, SiCN or SiC, etc., and is formed using the PE-CVD method, etc. In addition, the anti-diffusion insulating films 4a and 4b have a function of preventing diffusion of a metal contained in the wirings 5a, 5b and the via 6.

The wirings 5a, 5b and the via 6 are made of a conductive material such as Cu, etc. In addition, anti-diffusion metal films 7a and 7b which prevent the diffusion of the metal contained in the wirings 5a, 5b and the via 6 are formed on surfaces of the wirings 5a, 5b and the via 6. The anti-diffusion metal films 7a and 7b are made of a metal material such as Ta, TaN, Ti or TiN, etc.

The wiring 5a and the anti-diffusion metal film 7a are formed by, e.g., following process. Firstly, a wiring trench is formed in the cap insulating film 3a and the interlayer sacrificial film 2a by a lithography method and a RIE (Reactive Ion Etching) method. Next, material films of the wiring 5a and the anti-diffusion metal film 7a are filled in the wiring trench by a PVD (Physical Vapor Deposition) method or a plating method, etc. Next, portions of the material films of the wiring 5a and the anti-diffusion metal film 7a outside the wiring trench are removed by planarization treatment such as a CMP (Chemical Mechanical Polishing) method, etc., thereby shaping into the wiring 5a and the anti-diffusion metal film 7a.

The wiring 5b, the via 6 and the anti-diffusion metal film 7b are formed by, e.g., following process. Firstly, a wiring trench is formed in the cap insulating film 3b and the interlayer sacrificial film 2b by the lithography method and the RIE method, and a via hole is formed in the interlayer insulating film 1b and the anti-diffusion insulating film 4a. Next, material films of the wiring 5b and the anti-diffusion metal film 7b are filled in the wiring trench and the via hole by the PVD method or the plating method, etc. Next, portions of the material films of the wiring 5b and the anti-diffusion metal film 7b outside the wiring trench and the via hole are removed by the planarization treatment such as the CMP method, etc., thereby shaping into the wiring 5b, the via 6 and the anti-diffusion metal film 7b.

Next, as shown in FIG. 1B, the trench 8, which penetrates the anti-diffusion insulating film 4b, the cap insulating film 3b, the interlayer sacrificial film 2b, the interlayer insulating film 1b, the anti-diffusion insulating film 4a, the cap insulating film 3a and the interlayer sacrificial film 2a and which reaches the interlayer insulating film 1a, is formed. The trench 8 is formed by, e.g., the lithography method and anisotropic etching such as the RIE method, etc.

Note that, in order to remove the interlayer sacrificial films 2a and 2b, the trench 8 only needs to reach at least the interlayer sacrificial film 2a. Alternatively, when there is only one interlayer sacrificial film 2b as an interlayer sacrificial film, the trench 8 may be formed by etching the anti-diffusion insulating film 4b and the cap insulating film 3b so that a bottom of the trench 8 reaches an upper surface of the interlayer sacrificial film 2b. In addition, plural trenches 8 may be formed for efficiently removing the interlayer sacrificial films 2a and 2b.

Next, as shown in FIG. 1C, a gas permeable film 9 is formed in the trench 8. The gas permeable film 9 is a porous film made of $SiO_2$, SiOC, SiC or an organic material, etc., and is formed by, e.g., following process.

Firstly, a material film of the gas permeable film 9 is filled in the trench 8 by the PE-CVD method or the coating method, etc. Next, a portion of the filled material film of the gas permeable film 9 outside the trench 8 is removed, and continuously, a height of the upper surface of the material film in the trench 8 is further lowered by the RIE method, a CDE (Chemical Dry Etching) method or a wet etching method, etc., thereby shaping into the gas permeable film 9.

At this time, the gas permeable film 9 is preferably formed such that the upper surface thereof is the same as or higher than a height of a bottom of the cap insulating film 3b. This is in order to substantially completely prevent an entrance of a below-described sealing film 11 into below-described air gaps 10a and 10b during a process of forming the sealing film 11.

Furthermore, the gas permeable film 9 is preferably formed such that the height of the upper surface thereof is lower than an upper surface of the anti-diffusion insulating film 4b. This is in order to form the below-described sealing film 11 in the trench 8.

Next, as shown in FIG. 1D, the interlayer sacrificial films 2a and 2b are gasified and removed through the trench 8 and the gas permeable film 9, which results in that air gaps 10a and 10b are formed. Since the gas permeable film 9 has gas permeability, the gasified interlayer sacrificial films 2a and 2b are allowed to pass inside the gas permeable film 9. Here, the interlayer sacrificial films 2a and 2b are chemically or thermally gasified by, e.g., isotropic chemical dry etching using an oxygen ion or an oxygen radical as an etchant or a thermal decomposition method, etc.

Note that, it is possible to ensure a mechanical strength of the structure by the gas permeable film 9 even after forming the air gaps 10a and 10b. In order to ensure a higher mechanical strength, it is preferable that the bottom of the trench 8 is located in the same level as or lower than the bottom of the interlayer sacrificial film 2a which is a lowermost interlayer sacrificial film, and the bottom of the gas permeable film 9 is in contact with the bottom of the trench 8. In other words, in the present embodiment, it is preferable that the trench 8 reaches the interlayer insulating film 1a and the bottom of the gas permeable film 9 is in contact with the interlayer insulating film 1a.

Figure 1E:
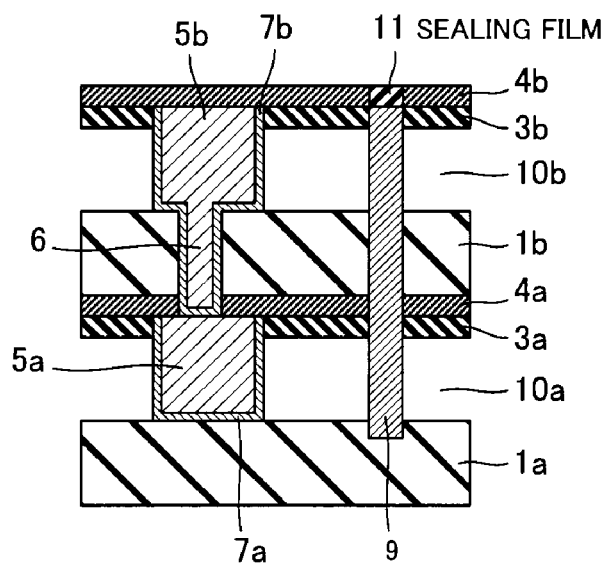

Next, as shown in FIG. 1E, a sealing film 11 which seals the air gaps 10a and 10b by blocking the vicinity of the opening of the trench 8 is formed on the gas permeable film 9 in the trench 8. The sealing film 11 has a function of preventing water or a material of an upper insulating member from entering inside of the air gaps 10a and 10b.

The sealing film 11 is made of an insulating material such as SiN, SiCN or SiC, etc., and is formed by, e.g., following process. Firstly, a material film of the sealing film 11 is filled in the trench 8 on the gas permeable film 9. Next, a portion of the filled material film of the sealing film 11 outside the trench 8 is removed by the RIE method, the CDE method, the wet etching method or the CMP method, etc., thereby shaping into the sealing film 11.

In addition, the sealing film 11 preferably has a function of preventing the diffusion of the metal contained in the wirings 5a, 5b and the via 6 as well as low-dielectric characteristics, and can be made of the same material as the anti-diffusion insulating films 4a and 4b. Note that, if the sealing film 11 is also formed outside of the trench 8, a level difference occurs on a sidewall of the via hole at the time of forming the upper wiring layers due to an etching rate difference between the sealing film 11 and the anti-diffusion insulating film 4b, consequently, there is concern that deterioration in electrical characteristics is caused by embedding failure of a material film for forming the upper wiring layers, thus, the sealing film 11 is preferably formed only in the trench 8. However, when the sealing film 11 is made of the same material or a material having properties close to the anti-diffusion insulating films 4a and 4b, it is not necessary to remove the portion outside the trench 8.

Effect of the First Embodiment

According to the first embodiment, since the sealing film 11 is formed using the gas permeable film 9 as a base, it is possible to substantially completely block the vicinity of the opening of the trench 8, thereby sealing the air gaps 10a and 10b. As a result, it is possible to prevent water or a material of an upper insulating member from entering inside of the air gaps 10a and 10b, thereby suppressing deterioration in operational reliability of a semiconductor device and an increase in electrical capacitance.

In addition, since the sealing film 11 is formed using the gas permeable film 9 as a base, it is possible to prevent the material film of the sealing film 11 from entering inside of the air gaps 10a and 10b, thereby suppressing the increase in electrical capacitance.

In addition, in the present embodiment, it has been explained that the air gaps 10a and 10b are simultaneously formed in two layers, however, it is possible to simultaneously form air gaps in a single layer or in multiple layers of three or more layers by adjusting a depth of the trench 8, etc.

In addition, there may be a layer of a wiring in which an air gap is not formed. For example, when a film made of the same material as the interlayer insulating films 1a and 1b is formed instead of the interlayer sacrificial film 2b, an air gap is not formed in a layer of the wirings 5b.

Alternatively, it is possible to form an air gap also in a layer of the via 6 by forming a film made of the same material as the interlayer sacrificial films 2a and 2b instead of forming the interlayer insulating film 1b.

Second Embodiment

The second embodiment is different from the first embodiment in a shape of the gas permeable film 9. Note that, the explanations will be omitted or simplified for the points same as the first embodiment.

Figure 2A:
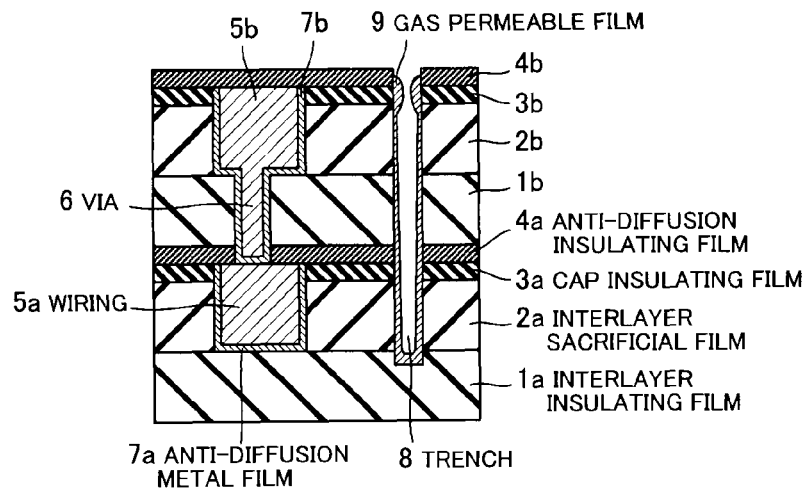
FIGS. 2A to 2C are cross sectional views showing a method of fabricating a semiconductor device according to a second embodiment.
Figure 2B:
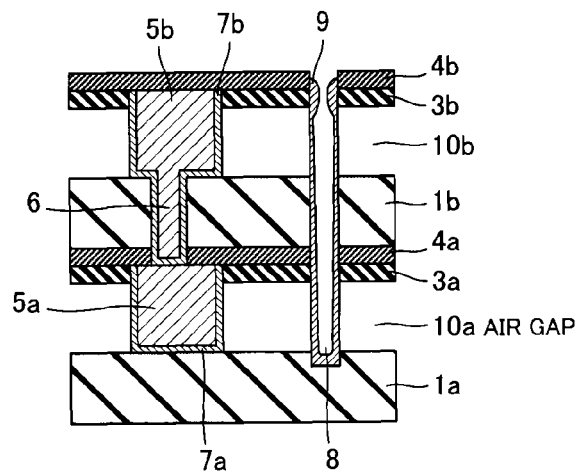
Figure 2C:
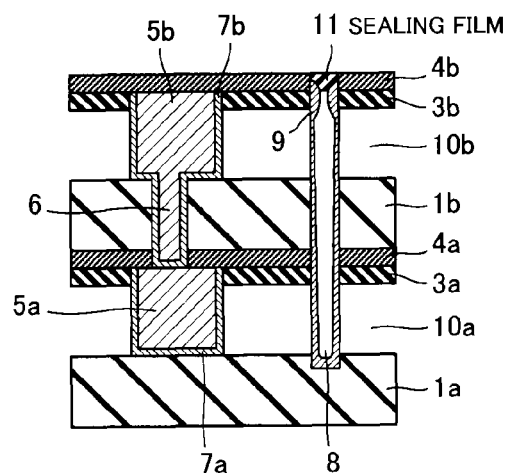

FIGS. 2A to 2C are cross sectional views showing a method of fabricating a semiconductor device according to a second embodiment.

Firstly, the processes until the process, shown in FIGS. 1A and 1B, for forming the trench 8 are carried out in the same way as the first embodiment.

Next, as shown in FIG. 2A, the gas permeable film 9 is formed in the trench 8. The gas permeable film 9 is formed by, e.g., following process.

Firstly, a material film of the gas permeable film 9 is deposited in the trench 8 by the PE-CVD method or the coating method, etc. At this time, the material film of the gas permeable film 9 is deposited along a side face of the trench 8 so that a void is formed in the gas permeable film 9. Next, a portion of the deposited material film of the gas permeable film 9 outside the trench 8 is removed, and continuously, a height of the upper surface of the material film in the trench 8 is further lowered by the RIE method, the CDE method or the wet etching method, etc., thereby shaping into the gas permeable film 9. Even in the case that the gas permeable film 9 includes a void therein but the vicinity of the opening of the trench 8 is not completely blocked, the gas permeable film 9 becomes an overhang shape at the vicinity of the opening of the trench 8 and it is thereby possible to narrow the opening size. Alternatively, the gas permeable film 9 may be shaped in a state of completely blocking the vicinity of the opening of the trench 8.

At this time, the gas permeable film 9 is preferably formed such that the upper surface thereof is the same as or higher than a height of a bottom of the cap insulating film 3b. This is in order to substantially completely prevent an entrance of a below-described sealing film 11 into below-described air gaps 10a and 10b during a process of forming the sealing film 11.

Furthermore, the gas permeable film 9 is preferably formed such that the height of the upper surface thereof is lower than an upper surface of the anti-diffusion insulating film 4b. This is in order to form the below-described sealing film 11 in the trench 8.

Next, as shown in FIG. 2B, the interlayer sacrificial films 2a and 2b are gasified and removed through the trench 8 and the gas permeable film 9, which results in that air gaps 10a and 10b are formed. At this time, since the gas permeable film 9 has gas permeability, it is possible to easily eliminate the gasified interlayer sacrificial films 2a and 2b to the outside regardless of the opening size of the vicinity of the opening of the trench 8 which is narrowed by the gas permeable film 9.

Next, as shown in FIG. 2C, the sealing film 11 is formed on the gas permeable film 9 in the vicinity of the opening of the trench 8. At this time, since a material of the sealing film 11 is less likely to fall into the trench 8 as compared with the case that the sealing film 11 is formed without forming the gas permeable film 9, it is possible to block the vicinity of the opening of the trench 8 more certainly. In addition, even if the material of the sealing film 11 slightly enters the inside through the vicinity of the opening, the entrance area thereof can be limited within the trench 8 where the side face thereof is covered by the gas permeable film 9.

Effect of the Second Embodiment

According to the second embodiment, even in the case that it is not possible to fill the gas permeable film 9 in the trench 8 without any gaps due to the problem of the material or a film formation method of the gas permeable film 9, it is possible to prevent water or a material of an upper insulating member from entering inside of the air gap, thereby suppressing deterioration in operational reliability of a semiconductor device and an increase in electrical capacitance, similarly to the first embodiment.

In addition, since volume of the gas permeable film 9 in the trench 8 is small compared with the first embodiment, an elimination of the gasified interlayer sacrificial films 2a and 2b to the outside is further facilitated.

Third Embodiment

The third embodiment is different from the first embodiment in a position for forming the gas permeable film 9. Note that, the explanations will be omitted or simplified for the points same as the first embodiment.

FIGS. 3A to 3E are cross sectional views showing a method of fabricating a semiconductor device according to a third embodiment.

Firstly, the processes until the process, shown in FIGS. 1A and 1B, for forming the trench 8 are carried out in the same way as the first embodiment.

Figure 3A:
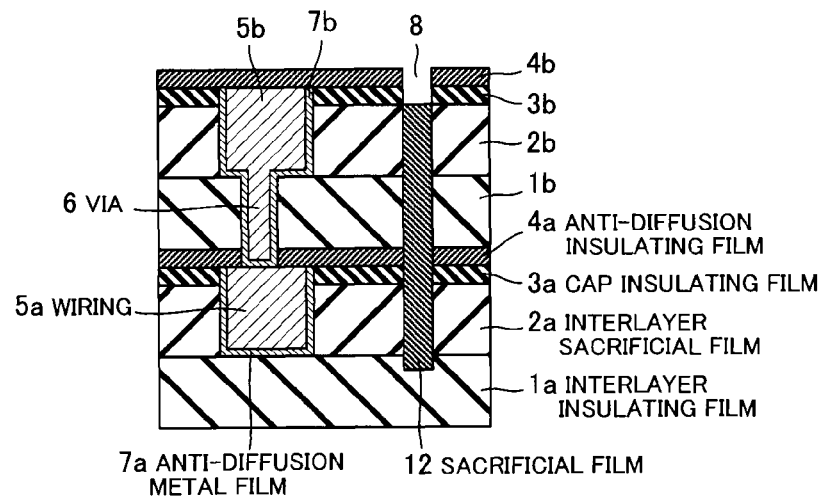
FIGS. 3A to 3E are cross sectional views showing a method of fabricating a semiconductor device according to a third embodiment.

Next, as shown in FIG. 3A, a sacrificial film 12 is formed in the trench 8. The sacrificial film 12 is made of, e.g., an organic material such as hydrocarbon, etc., which is chemically gasified by forming $CO_2$ by the reaction with an oxygen ion or an oxygen radical, an organic material such as hydrocarbon, etc., which is thermally gasified by thermal decomposition by thermal energy applied thereto, or an organic material such as hydrocarbon, etc., which is gasified by ultraviolet irradiation. The sacrificial film 12 is formed by, e.g., following process.

Firstly, a material film of the sacrificial film 12 is filled in the trench 8 by the PE-CVD method or the coating method, etc. Next, a portion of the filled material film of the sacrificial film 12 outside the trench 8 is removed, and continuously, a height of the upper surface of the material film in the trench 8 is further lowered by the RIE method, the CDE method or the wet etching method, etc., thereby shaping into the sacrificial film 12.

At this time, the sacrificial film 12 is preferably formed such that the upper surface thereof is the same as or higher than a height of a bottom of the cap insulating film 3b. This is in order to form the below-described gas permeable film 9 so as to contact with at least one of the cap insulating film 3b and the anti-diffusion insulating film 4b for preventing the gas permeable film 9 from falling at the time of forming the below-described air gaps 10a and 10b.

Furthermore, the sacrificial film 12 is preferably formed such that the height of the upper surface thereof is lower than an upper surface of the anti-diffusion insulating film 4b. This is in order to form the below-described gas permeable film 9 and sealing film 11 in the trench 8.

Figure 3B:
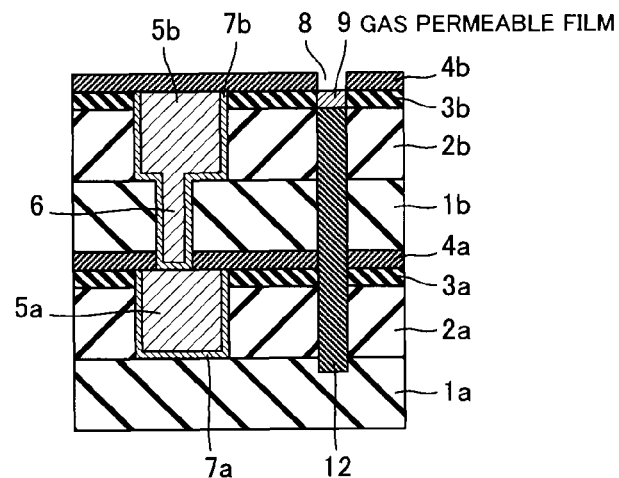

Next, as shown in FIG. 3B, the gas permeable film 9 is formed on the sacrificial film 12 in the trench 8. The gas permeable film 9 is formed by, e.g., following process.

Firstly, a material film of the gas permeable film 9 is filled on the sacrificial film 12 in the trench 8 by the PE-CVD method or the coating method, etc. Next, a portion of the filled material film of the gas permeable film 9 outside the trench 8 is removed, and continuously, a height of the upper surface of the material film in the trench 8 is further lowered by the RIE method, the CDE method or the wet etching method, etc., thereby shaping into the gas permeable film 9.

At this time, a thickness of the gas permeable film 9 is preferably 5 nm or more from the viewpoint of suppressing an entrance of a large amount of the material of the sealing film 11 through the gas permeable film 9. In addition, in order to form the below-described sealing film 11 in the trench 8, the gas permeable film 9 is preferably formed such that the height of the upper surface thereof is lower than a height of the upper surface of the anti-diffusion insulating film 4b.

Figure 3C:
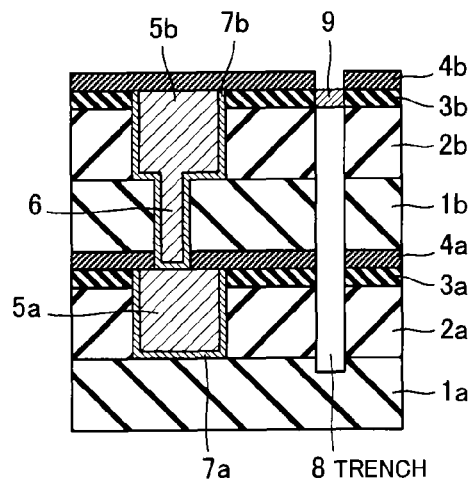

Next, as shown in FIG. 3C, the sacrificial film 12 is gasified and removed through the trench 8 and the gas permeable film 9. Since the gas permeable film 9 has gas permeability, the gasified sacrificial film 12 is allowed to pass inside the gas permeable film 9. Here, the sacrificial film 12 is chemically or thermally gasified by, e.g., isotropic chemical dry etching using an oxygen ion or an oxygen radical as an etchant, ultraviolet irradiation or a thermal decomposition method, etc.

Figure 3D:
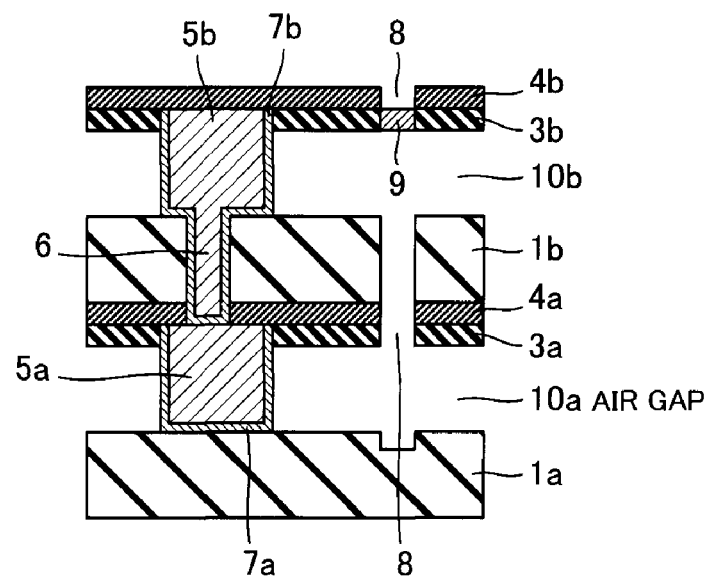

Next, as shown in FIG. 3D, the interlayer sacrificial films 2a and 2b are gasified and removed through the trench 8 and the gas permeable film 9, which results in that air gaps 10a and 10b are formed. Since the gas permeable film 9 has gas permeability, the gasified interlayer sacrificial films 2a and 2b are allowed to pass inside the gas permeable film 9. Here, the interlayer sacrificial films 2a and 2b are chemically or thermally gasified by, e.g., isotropic chemical dry etching using an oxygen ion or an oxygen radical as an etchant or a thermal decomposition method, etc.

Note that, when the sacrificial film 12, the interlayer sacrificial films 2a and 2b are gasified by the same treatment, it is possible to remove the sacrificial film 12, the interlayer sacrificial films 2a and 2b in one process.

Figure 3E:
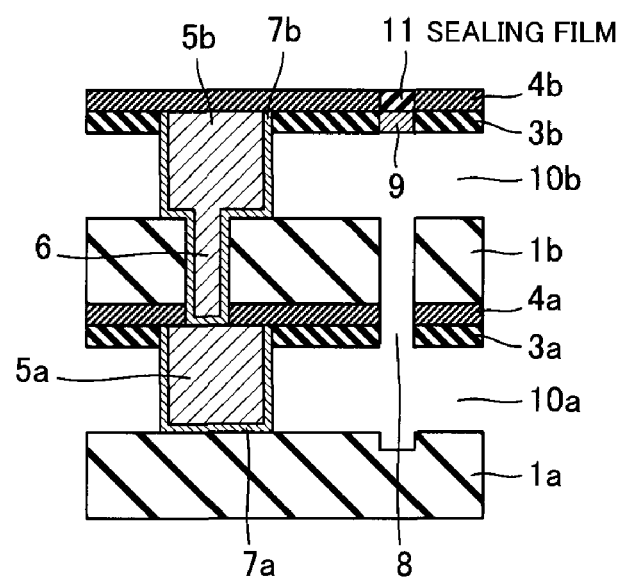

Next, as shown in FIG. 3E, the sealing film 11 is formed on the gas permeable film 9 in the trench 8. The sealing film 11 is formed by, e.g., following process. Firstly, a material film of the sealing film 11 is filled in the trench 8 on the gas permeable film 9 by the PE-CVD method or the coating method. Next, a portion of the filled material film of the sealing film 11 outside the trench 8 is removed by the RIE method, the CDE method, the wet etching method or the CMP method, etc., thereby shaping into the sealing film 11.

Effect of the Third Embodiment

According to the third embodiment, since the gas permeable film 9 is formed using the sacrificial film 12 as a base, filling the gas permeable film 9 in the vicinity of the opening of the trench 8 is facilitated. Therefore, it is particularly effective when a film having poor coatability is used as the gas permeable film 9.

In addition, since volume of the gas permeable film 9 in the trench 8 is small compared with the first embodiment, an elimination of the gasified interlayer sacrificial films 2a and 2b to the outside is further facilitated.

Other Embodiments

It should be noted that the above-mentioned first to third embodiments are only an example and the present invention is not intended to be limited thereto, and the various kinds of changes thereof can be implemented by those skilled in the art without departing from the gist of the invention.

In addition, the constituent elements of the above-mentioned embodiments can be arbitrarily combined with each other without departing from the gist of the invention.

What is claimed is:

1. A method of fabricating a semiconductor device, comprising:
    forming an interlayer sacrificial film and an insulating film located thereon above a semiconductor substrate having a semiconductor element, the interlayer sacrificial film having a wiring provided therein;
    etching the insulating film, or, etching the insulating film and the interlayer sacrificial film to form a trench reaching the interlayer sacrificial film;
    forming a gas permeable film in the trench;
    gasifying and removing the interlayer sacrificial film through the trench and the gas permeable film; and
    forming a sealing film on the gas permeable film for sealing the vicinity of an opening of the trench after removing the interlayer sacrificial film.

2. The method of fabricating a semiconductor device according to claim 1, wherein, after forming a sacrificial film in the trench, the gas permeable film is formed on the sacrificial film in the trench; and
    after gasifying and removing the sacrificial film through the trench and the gas permeable film, the interlayer sacrificial film is gasified and removed through the trench and the gas permeable film.

3. The method of fabricating a semiconductor device according to claim 2, wherein the sacrificial film is gasified by chemical dry etching, ultraviolet irradiation or a thermal decomposition method.

4. The method of fabricating a semiconductor device according to claim 3, wherein the sacrificial film comprises hydrocarbon.

5. The method of fabricating a semiconductor device according to claim 3, wherein the interlayer sacrificial film is gasified by chemical dry etching or a thermal decomposition method.

6. The method of fabricating a semiconductor device according to claim 5, wherein the sacrificial film and the interlayer sacrificial film are removed by the same treatment.

7. The method of fabricating a semiconductor device according to claim 6, wherein the sacrificial film and the interlayer sacrificial film comprise hydrocarbon.

8. The method of fabricating a semiconductor device according to claim 2, wherein a height of an upper surface of the sacrificial film is the same as or higher than a height of a bottom of the insulating film and lower than a height of an upper surface of the insulating film.

9. The method of fabricating a semiconductor device according to claim 1, wherein the gas permeable film is formed so as to include a void therein.

10. The method of fabricating a semiconductor device according to claim 9, wherein the gas permeable film is formed so as to have an overhang shape in the vicinity of the opening of the trench.

11. The method of fabricating a semiconductor device according to claim 1, wherein the interlayer sacrificial film is gasified by chemical dry etching or a thermal decomposition method.

12. The method of fabricating a semiconductor device according to claim 11, wherein the interlayer sacrificial film comprises hydrocarbon.

13. The method of fabricating a semiconductor device according to claim 1, wherein the gas permeable film comprises a porous film.

14. The method of fabricating a semiconductor device according to claim 1, wherein a height of an upper surface of the gas permeable film is the same as or higher than a height of a bottom of the insulating film and lower than a height of an upper surface of the insulating film.

15. The method of fabricating a semiconductor device according to claim 1, wherein the trench is formed so that a bottom thereof reaches the same level as or lower than a bottom of the interlayer sacrificial film; and
the gas permeable film is formed so that a bottom thereof is in contact with the bottom of the trench.

16. A method of fabricating a semiconductor device, comprising:
forming a first interlayer sacrificial film and a first insulating film located thereon above a semiconductor substrate having a semiconductor element via a second interlayer sacrificial film and a second insulating film located thereon, the first interlayer sacrificial film having a first wiring provided therein and the second interlayer sacrificial film having a second wiring provided therein;
etching the first insulating film, the first interlayer sacrificial film and the second insulating film, or, etching the first insulating film, the first interlayer sacrificial film, the second insulating film and the second interlayer sacrificial film to form a trench reaching the second interlayer sacrificial film;
forming a gas permeable film in the trench;
gasifying and removing the first interlayer sacrificial film and the second interlayer sacrificial film through the trench and the gas permeable film; and
forming a sealing film on the gas permeable film for sealing the vicinity of an opening of the trench after removing the first interlayer sacrificial film and the second interlayer sacrificial film.

17. The method of fabricating a semiconductor device according to claim 16, wherein the first interlayer sacrificial film and the second interlayer sacrificial film are gasified by chemical dry etching or a thermal decomposition method.

18. The method of fabricating a semiconductor device according to claim 17, wherein the first interlayer sacrificial film and the second interlayer sacrificial film comprise hydrocarbon.

19. The method of fabricating a semiconductor device according to claim 16, wherein a height of an upper surface of the gas permeable film is the same as or higher than a height of a bottom of the first insulating film and lower than a height of an upper surface of the first insulating film.

20. The method of fabricating a semiconductor device according to claim 16, wherein the trench is formed so that the bottom thereof reaches the same level as or lower than a bottom of the second interlayer sacrificial film; and
the gas permeable film is formed so that a bottom thereof is in contact with the bottom of the trench.

* * * * *